United States Patent [19]
Imatou et al.

[11] Patent Number: 4,970,366
[45] Date of Patent: Nov. 13, 1990

[54] LASER PATTERNING APPARATUS AND METHOD

[75] Inventors: Shinji Imatou, Atsugi; Hisato Shinohara, Sagamihara, both of Japan

[73] Assignee: Semiconductor Enerby Laboratory Co., Ltd., Atsugi, Japan

[21] Appl. No.: 328,502

[22] Filed: Mar. 24, 1989

[30] Foreign Application Priority Data

Mar. 27, 1988 [JP] Japan .................................. 63-74098

[51] Int. Cl.⁵ ............................................. B23K 26/00
[52] U.S. Cl. ........................... 219/121.68; 219/121.75; 219/121.82; 219/121.83
[58] Field of Search ....................... 219/121.68, 121.69, 219/121.75, 121.82, 121.83, 121.78

[56] References Cited
U.S. PATENT DOCUMENTS

| | | | |
|---|---|---|---|
| 3,422,246 | 1/1969 | Wetzel | 219/121.82 X |
| 3,668,028 | 6/1972 | Short | 219/121.69 X |
| 4,323,755 | 4/1982 | Nierenberg | 219/121.75 X |
| 4,752,668 | 6/1988 | Rosenfield et al. | 219/121.68 |

*Primary Examiner*—C. L. Albritton
*Attorney, Agent, or Firm*—Sixbey, Friedman, Leedom & Ferguson

[57] ABSTRACT

An improved laser patterning method and apparatus is described. A number of parallel grooves can be formed on a glass substrate coated with an ITO film by projecting flat laser pulses while the substrate is continuously sliding. By this process, the process time for producing a substrate for liquid crystal display can be reduced.

5 Claims, 3 Drawing Sheets

SLIDING DIRECTION

LASER PATTERNING APPARATUS AND METHOD

BACKGROUND OF THE INVENTION

The present invention relates to a laser patterning apparatus and method.

Photolithography is a well-known technique for producing patterns in thin films formed on substrates. This technique is convenient and advantageous, having regard to the desirability of removing portions of the thin film to be processed without causing damage to the underlying surface. However, a somewhat large number of steps is necessary for completing the patterning procedure in accordance with this method. Namely, after forming the thin film to be treated on a substrate, a photoresist film is formed and patterned, then the thin film is subjected to the action of an etchant with the patterned photoresist film used as a mask, and then the photoresist film is removed.

Laser scribing techniques are well known in the art and provide a low cost patterning method capable of operation at high speed. The YAG laser (IR light, 1.06 microns) is a representative laser which has been generally used for this purpose. Since the optical energy of this laser is only 1.23 eV, however, tin oxide, indium oxide (or ITO), ZnO and other materials having optical energy gaps of about 3 to 4 eV are not effectively processed by the YAG laser. Since transparent conductive oxide (CTO) films are generally made of this class of materials, the inability of YAG lasers to scribe such materials is a significant disadvantage.

The applicant has proposed the use of eximer lasers in order to emit pulsed laser beams for performing the laser scribing of transparent conductive films. The wavelength of the excimer laser beams is notgreater than 400 nm, equivalent to photon energies higher than 3.1 eV. With such an excimer laser, patterning can be performed by moving and positioning the laser beams relative to a surface to be patterned, and projecting a laser beam on the surface. For example, when a plurality of parallel grooves is formed, a substrate to be patterned is moved to an appropriate position relative to the laser beam projection position and irradiated with a flat laser beam, and this procedure is repeated in order to form parallel grooves. There is a significant disadvantage in this process. It must be repeated to move and stop the substrate relative to the laser projection position. This makes it difficult to make short the process time required for patterning. Particularly, the projection of a laser beam can not be done just after the stop of the substrate at a proper position. Rather, there has to wait a certain time between the projection and the stop of the substrate in order to avoid the influence of vibrations taking place just after the stop.

SUMMARY OF THE INVENTION

It is an object of the present invention to provide a laser patterning apparatus and method capable of performing patterning at high speed.

In order to accomplish the above and other objects and advantages, it is propose to synchronize the movement of a substrate to be patterned relative to laser beams and the projection timing whereas the relative movements is substrate to be patterned made at a constant speed without stopping the substrate. The laser is preferably an excimer laser because the excimer laser is capable of emitting laser pulses having a short wavelength, e.g. less than 400 nm, (consisting of high energy photons) and a short pulse width. The excimer laser is suitable for eliminating the material of the surface to be patterned by sublimation within a very short time. The laser beam is shaped into a flat beam having, e.g. a cross section of 400 mm × 10 micrometers in order to scribe a groove.

DETAILED DESCRIPTION OF THE PREFERRED EMBODIMENTS

Figure 1:
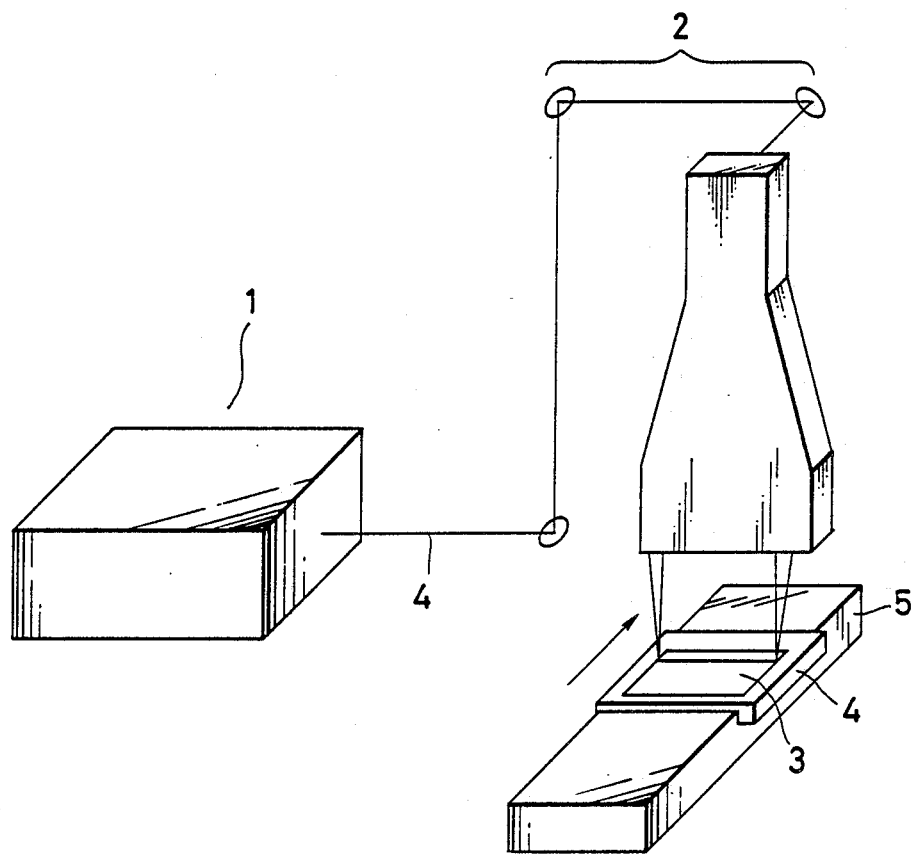
FIG. 1 is a schematic view showing a laser patterning apparatus in accordance with the present invention.

Referring now to FIG. 1, a laser patterning apparatus in accordance with the present invention is schematically illustrated. The apparatus is comprised of a KrF excimer laser 1 capable of emitting laser beams at 248 nm, an optical system 2 for guiding the laser beams to a substrate 3 to be patterned by means of mirrors and for focussing the laser beams to the substrate by means of a lens assembly, and a substrate holder comprising a base 5 and a table 4 adapted to slide on the base 5. The base 5 is equipped with an electrical mechanism for sliding the table 4. The optical system 2 may include cylindrical lens.

A laser beam emitted from the laser 1 is reflected several times by the mirrors as illustrated in FIG. 1, shaped into a flat beam by means of the lens assembly, and finally focussed on the substrate 3. The laser beam is formed to have a cross sectional view of, at the substrate surface, 10 to 60 cm length, e.g. 30 cm length and 10 to 200 micrometers width, e.g. 150 micrometers width. The substrate 3 is for example a glass substrate coated with an ITO film.

Figure 3:
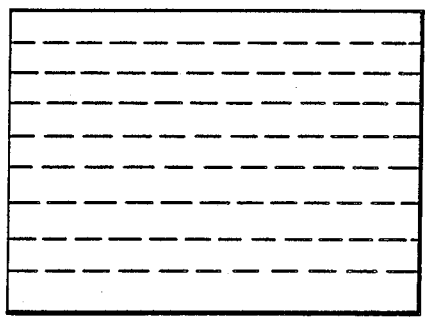
FIG. 3 is a plan view showing an example of a substrate to be patterned.

Grooves to be scribed on the substrate 3 are arranged parallel as shown in FIG. 3 at intervals of 400 micrometers. During the laser scribing, the substrate 3 is caused to continuously slide in the direction perpendicular to the grooves at 100 mm/sec. In this condition, the laser pulses are to be projected on the substrate 3 at 250 Hz.

Figure 2:
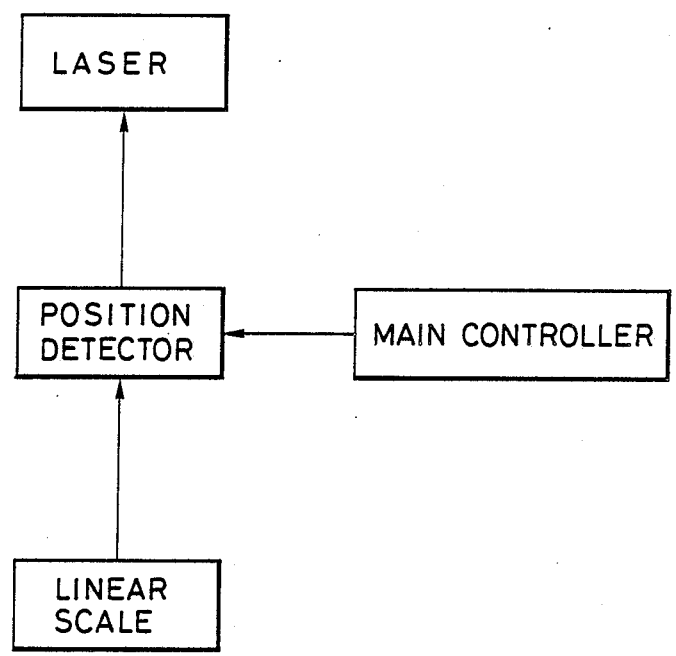
FIG. 2 is a block diagram showing a method for establishing synchronization between the current position of a substrate to be patterned and the emission timing of laser pulses.

The base 5 includes a linear scale (or rotary encoder), a position detector equipped with a CPU and a main controller as illustrated in FIG. 2. The linear scale measures the position of the table 4 and outputs the position information to the position detector. The position detector sends trigger pulses to the the laser 1 at appropriate timing in accordance with the instruction from the main controller. The position information consists of a sequence of position pulses which are output at each one micrometer shift of the table 4. The position detector counts the position pulses and, when the count reaches 400, produces a trigger pulse to the laser followed by reset of the count.

In this embodiment, the accuracy of positioning of the table is not lower than ±1 micrometer relative to the base, and not lower than ±6 micrometers relative to the floor on which the system is placed. The laser 1 have to be triggered within 5 microseconds after the table is passed through one of the projection positions.

The pulse width of the laser beam has to be not less than 40 nm.

In accordance with a prior art system, it took 0.2 second to form one groove, 0.02 second to project a laser beam, and about 3 minutes and 49 seconds to complete laser scribing in order to produce an ITO pattern on a substrate for use of a liquid crystal display having 640×400 pixels. With the laser patterning apparatus in accordance with the present invention, one patterned substrate of this liquid crystal display of the same type could be produced at a process time of about 21 seconds.

While several embodiments have been specifically described, it is to be appreciated that the present invention is not limeted to the particular examples described and that modifications and variations can be made without departure from the scope of the invention as defined by the append claims. For example, each groove can be formed by plural times projection of laser beams. In this case, the table supporting the substrate repeatedly slide to and fro on the base. Also, it is possible to shift the laser beam projection position by means of a suitable optical system instead of sliding of the table supporting a substrate.

I claim:

1. A laser patterning apparatus comprising:
   a table for supporting thereon a substrate to be patterned;
   a base for sliding said table thereon in a direction;
   a means for determining the current position of said table relative to said base;
   an excimer laser capable of emitting pulsed laser beams;
   an optical system for guiding and focusing said laser beam on said substrate; and
   a means for controlling said laser to emit a laser beam pulse at the time when said table is just in the position required to produce a predetermined pattern;
   wherein said laser emission is repeated onto different surface portions of said substrate whereas said substrate continuously slides on said base.

2. The apparatus of claim 1 wherein said optical system is adapted to shape said laser beam into a flat beam.

3. A method of producing a pattern comprising the steps of:
   emitting a pulsed laser beam from an excimer laser;
   focusing said pulsed laser beam on a surface to be patterned; and
   repeating said emitting and focussing steps while said surface is moving relative to the focal point of said laser beam.

4. The method of claim 3 further comprising the step of shaping said pulsed laser beam into a flat beam.

5. The method of claim 4 wherein pulsed laser beams are emitted at constant intervals in order to produce a plurality of grooves.

* * * * *